(12) United States Patent
Weng

(10) Patent No.: US 8,222,665 B2
(45) Date of Patent: Jul. 17, 2012

(54) LED PACKAGE STRUCTURE WITH FUSE

(75) Inventor: Ssu-Yuan Weng, Taipei Hsien (TW)

(73) Assignee: Everlight Electronics Co., Ltd., Shulin Dist., New Taipei (TW)

( * ) Notice: Subject to any disclaimer, the term of this patent is extended or adjusted under 35 U.S.C. 154(b) by 0 days.

(21) Appl. No.: 12/540,380

(22) Filed: Aug. 13, 2009

(65) Prior Publication Data
US 2010/0301374 A1    Dec. 2, 2010

(30) Foreign Application Priority Data
May 27, 2009    (TW) ................................ 98117650 A

(51) Int. Cl.
*H01L 33/00* (2010.01)
(52) U.S. Cl. ............................... 257/99; 257/98; 257/100
(58) Field of Classification Search ............. 257/98–100
See application file for complete search history.

(56) References Cited

U.S. PATENT DOCUMENTS

| | | | |
|---|---|---|---|
| 4,157,486 A * | 6/1979 | Fegley .............................. | 315/71 |
| 5,530,318 A | 6/1996 | Ensign, Jr. | |
| 6,259,170 B1 * | 7/2001 | Limoge et al. ................ | 307/10.8 |
| 6,310,364 B1 * | 10/2001 | Uemura ......................... | 257/100 |
| 2003/0098651 A1 * | 5/2003 | Lin et al. ........................ | 313/600 |
| 2004/0257191 A1 * | 12/2004 | Muller .......................... | 337/159 |
| 2006/0197646 A1 * | 9/2006 | Suzuki .......................... | 337/167 |
| 2008/0007885 A1 * | 1/2008 | Mehrl et al. ................... | 361/104 |
| 2010/0127247 A1 * | 5/2010 | Yang et al. ...................... | 257/40 |

FOREIGN PATENT DOCUMENTS

| | | |
|---|---|---|
| CN | 1549291 A | 11/2004 |
| CN | 101197351 A | 6/2008 |
| JP | 8321578 | 12/1996 |
| JP | 9199761 | 7/1997 |

* cited by examiner

*Primary Examiner* — Marcos D. Pizarro
*Assistant Examiner* — Bilkis Jahan
(74) *Attorney, Agent, or Firm* — Winston Hsu; Scott Margo

(57) ABSTRACT

An LED package structure includes a lead frame, an LED chip disposed on the lead frame, a fuse disposed on the lead frame and electrically connected to the lead frame, and an encapsulation. The fuse is electrically connected to the LED chip in series.

13 Claims, 6 Drawing Sheets

LED PACKAGE STRUCTURE WITH FUSE

BACKGROUND OF THE INVENTION

1. Field of the Invention

The present invention relates to a light emitting diode (LED) package structure, and more particularly, to an LED package structure with a fuse.

2. Description of the Prior Art

Since an LED possesses advantages of long lifetime, small size, shock-proof property, low heat emission and low electric power consumption, the LED has been widely used as an indicative lamp or a light source for various household appliances and instruments, and even in various types of mobile electronic products or large-sized array-type LED products such as car electronic products, wireless communication products, traffic signal system and outdoor bulletin boards.

LED chips are current-driven, and thus a stable current flow should be supplied to the LED chips as a power source, such that the LED chips can emit stable illumination lights. In the past, most of the LED chips are low power LED chips, which require low driving current to provide light. Nevertheless, the high illumination and high power applications of LED have gradually become trendy. In addition, most circuit system now requires and drives a plurality of LED chips electrically connected in series or in parallel, instead of a single LED chip. In view of this, the circuit system has to supply higher current to drive the LED chips than before. It should be noted that when the driving current increases, the short-circuit probability increases as well. Particularly, as the power source is normally a voltage source and as the impedance of each of the LEDs is substantially different, the current may become instable. For this reason, when the current inside the system becomes extremely high, the LED chip may be damaged or burned down. Therefore, to prevent the damage of LED chip due to increase of input current and to enhance the circuit protection ability of LED package structure is a critical issue.

SUMMARY OF THE INVENTION

One object of the present invention is to provide an LED package structure to be configured to protect the LED chip and the circuit system electrically connected to the LED chip from damages.

In order to achieve the aforementioned object, the present invention provides an LED package structure. The LED package structure includes a lead frame, an LED chip disposed on the lead frame, a fuse disposed on the lead frame and electrically connected to the lead frame and an encapsulation. The fuse is electrically connected to the LED chip in series, and the encapsulation covers the LED chip, the fuse and at least a part of the lead frame.

The present invention provides an LED package structure with a fuse, wherein the fuse is electrically connected to the LED chip in series. In such a connection, the LED chip and the circuit system electrically connected to the LED chip are free from high current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
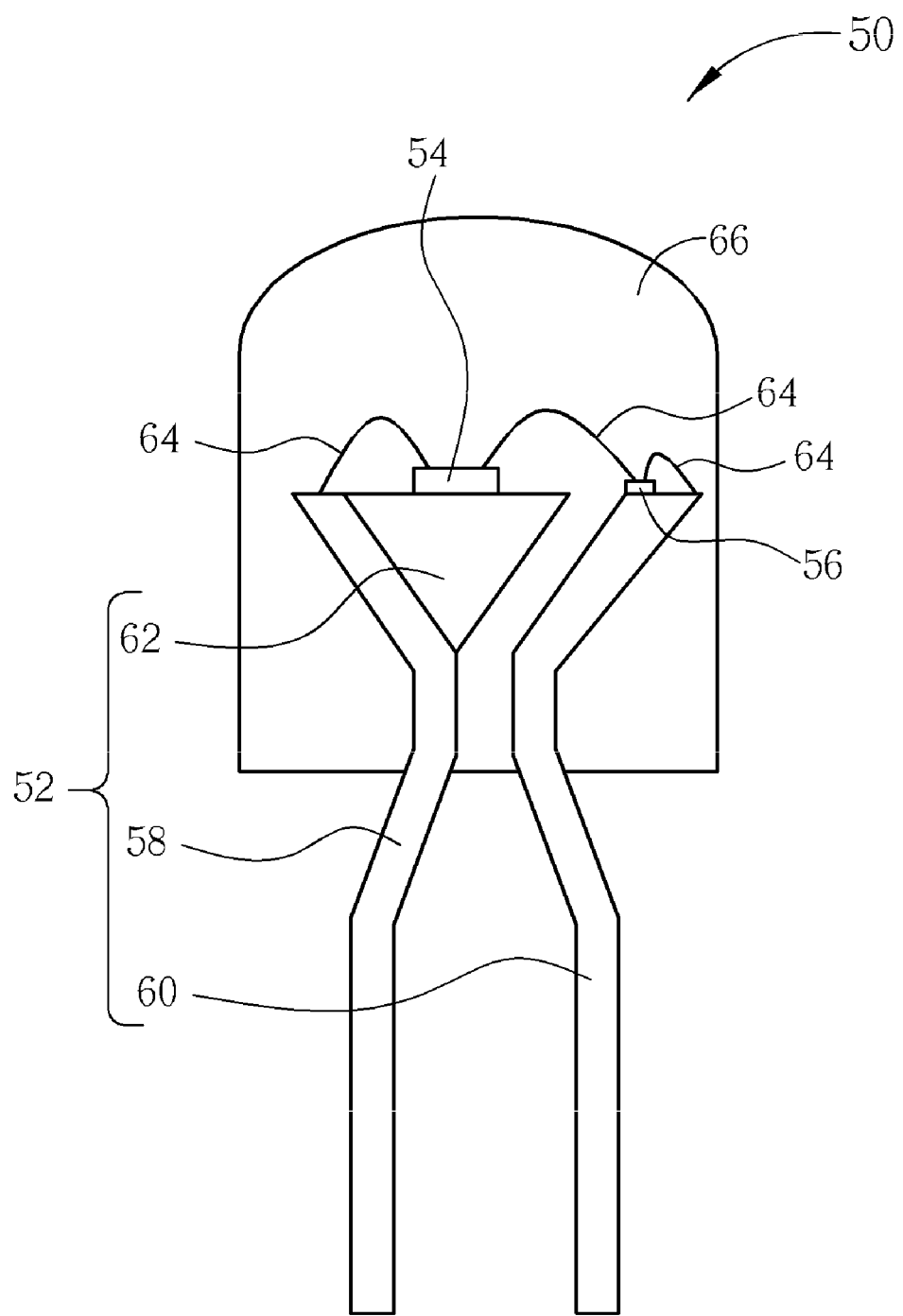
FIG. 1 is a cross-sectional schematic diagram illustrating an LED package structure of a first embodiment of the present invention.
Figure 2:
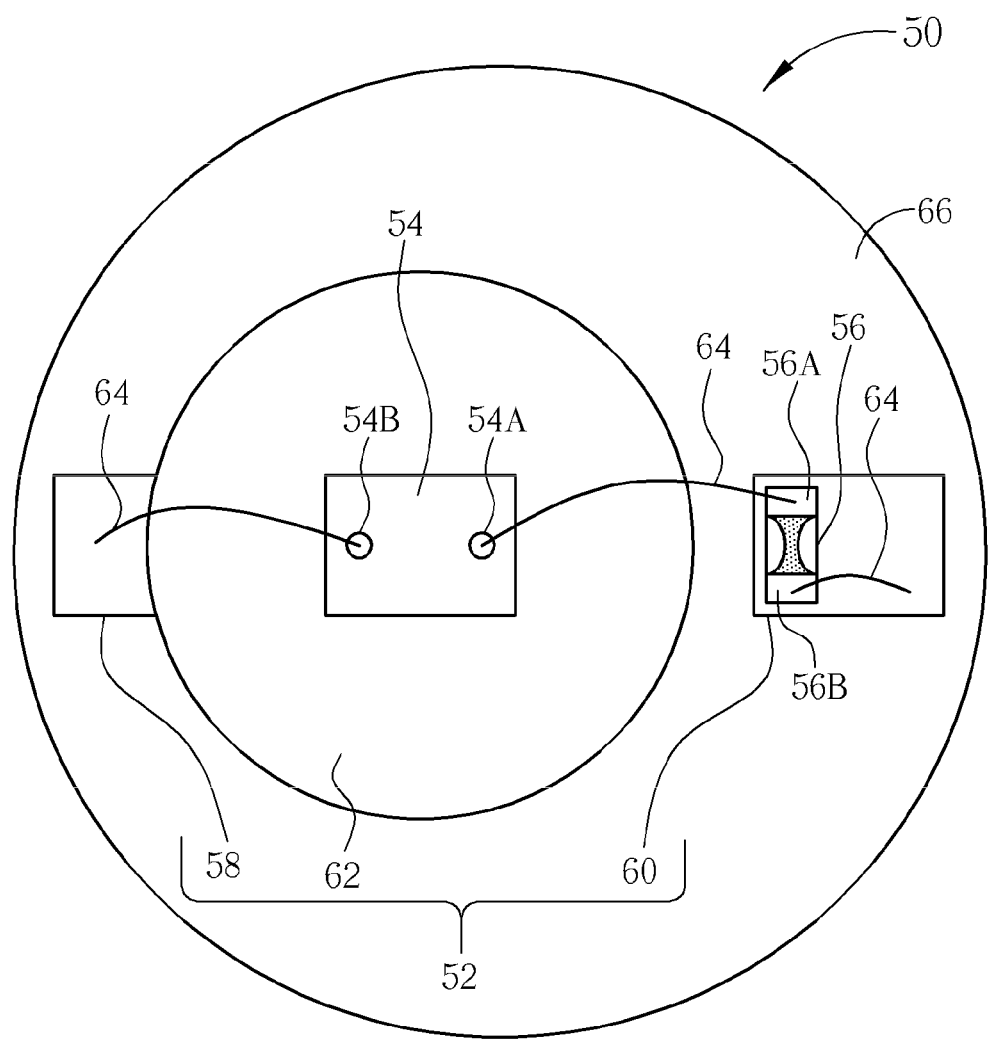
FIG. 2 is a top view schematic diagram illustrating an LED package structure of a first embodiment of the present invention.

With reference to FIG. 1 and FIG. 2, FIG. 1 is a cross-sectional schematic diagram illustrating an LED package structure of a first embodiment of the present invention, and FIG. 2 is a top view schematic diagram illustrating an LED package structure of a first embodiment of the present invention. As illustrated in FIG. 1 and FIG. 2, the LED package structure 50 includes a lead frame 52, an LED chip 54 and a fuse 56. The lead frame 52 includes a first lead pin 58, a second lead pin 60 and a loading part 62 connected to the first lead pin 58. The LED chip 54 includes a positive electrode 54A and a negative electrode 54B disposed on the loading part 62 of the lead frame 52. In addition, in this embodiment, the fuse 56 is disposed on the second lead pin 60 of the lead frame 52, a first electrode 56A of the fuse 56 is electrically connected to the positive electrode 54A of the LED chip 54, and a second electrode 56B of the fuse 56 is electrically connected to the second lead pin 60 of the lead frame 52.

In addition, as illustrated in FIG. 2, the LED package structure 50 further includes a plurality of metal conductive wires 64 to be configured to electrically connect the fuse 56, the LED chip 54 and the lead frame 52. The metal conductive wires 64 may be made of gold, but not limited. In this embodiment, by virtue of wire bonding process, the metal conductive wires 64 are configured to electrically connect the positive electrode 54A of the LED chip 54 and the first electrode 56A of the fuse 56, to electrically connect the second electrode 56B of the fuse 56 and the second lead pin 60 of the lead frame 52, and to electrically connect the negative electrode 54B of the LED chip 54 and the first lead pin 58 of the lead frame 52, such that the LED chip 54 and the fuse 56 are electrically connected in series between the first lead pin 58 of the lead frame 52 and the second lead pin 60 of the lead frame 52. However, the circuit connection of the present invention is not limited to the aforementioned connection. For instance, the locations of the positive electrode 54A and the negative electrode 54B of the LED chip 54 illustrated in FIG. 2 may be exchanged. That is to say, in the present invention, the metal conductive wires 64 may be used to electrically connect the negative electrode 54B of the LED chip 54 and the first electrode of the fuse 56, to electrically connect the second electrode of the fuse 56 and the first lead pin 58 of the lead frame 52, and to electrically connect the positive electrode 54A of the LED chip 54 and the second lead pin 60 of the lead frame 52.

As illustrated in FIG. 1, the LED package structure 50 further includes an encapsulation 66. The encapsulation 66 covers parts of the first lead pin 58 and the second lead pin 60 of the lead frame 52, the loading part 62 of the lead frame 52, the LED chip 54, the fuse 56 and the metal conductive wires 64 so as to efficiently protect the LED chip 54 and the fuse 56. With the encapsulation 66, the stable electrical connections between the metal conductive wires 64, the LED chip 54, the fuse 56 and the lead frame 52 are enhanced. Accordingly, the malfunction in the LED package structure 50 obviated. The present invention is not limited to the aforementioned package structure. For example, the encapsulation 66 may cover only parts of the lead frame 52 and surround the LED chip 54, the fuse 56 and the metal conductive wires 64. In such a case, the components surrounded by the encapsulation 66 are protected from damages due to external force. The material of the encapsulation 66 can be epoxy, silicone and, polyamide, etc.

Figure 3:
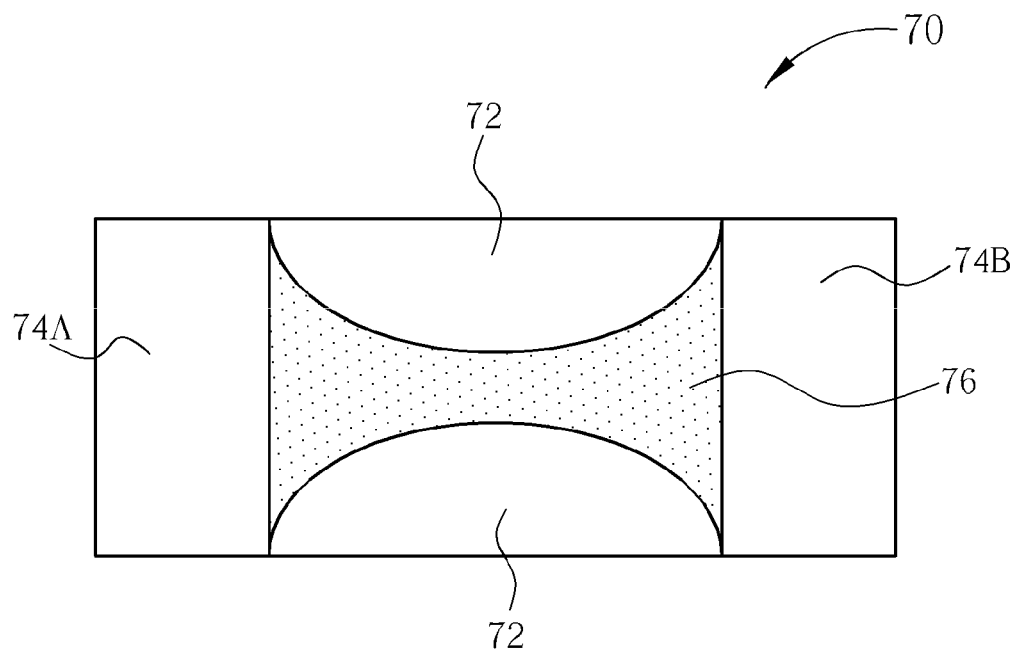
FIG. 3 is a top view schematic diagram illustrating the chip fuse.
Figure 4:
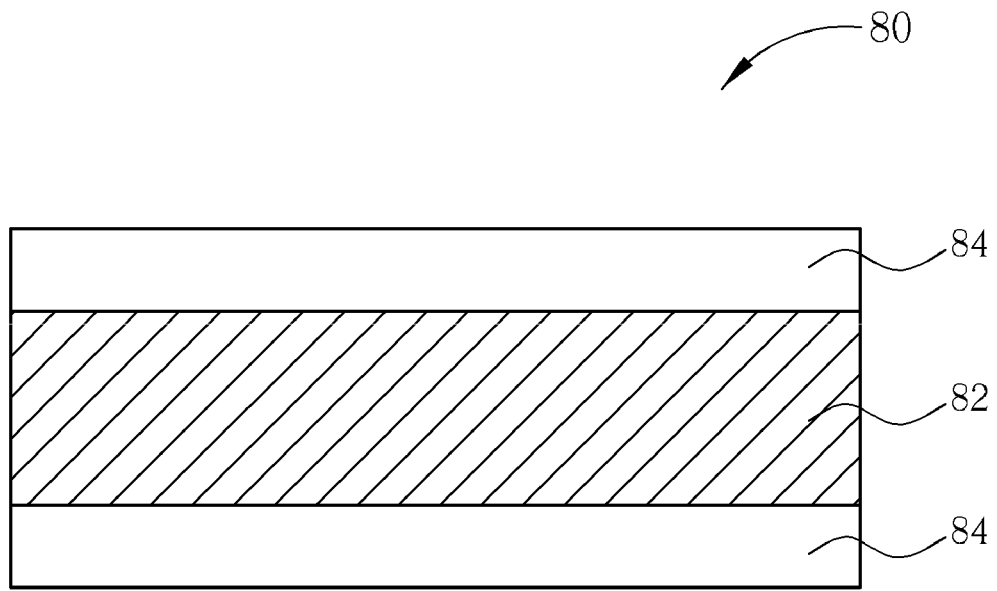
FIG. 4 is a cross-sectional schematic diagram illustrating a resettable fuse.

It should be noted that the fuse 56 is electrically connected to the LED chip 54 in series. Therefore, when a higher current in excess of the current limit threshold is supplied to the circuit system, the internal circuit of the fuse 56 will be melted so as to protect the LED chip 54. In such a connection, damages or burning of the LED chip 54 due to high current may be prevented. In this embodiment, the fuse 56 is preferably a chip fuse, but not limited. With reference to FIG. 3, FIG. 3 is a top view schematic diagram illustrating a chip fuse. As illustrated in FIG. 3, the chip fuse 70 includes a substrate 72, a first electrode 74A, a second electrode 74B and a low melting point metal conductive pad 76 disposed on the substrate 72. The first electrode 74A and the second electrode 74B are disposed on the substrate 72, and electrically connected together through the low melting point metal conductive pad 76. The preferred material of the substrate 72 is silicon, but not limited. Also, the melting point of the metal conductive pad 76 is substantially low. Thus, when the current provided by the circuit system passes the metal conductive pad 76, the temperature of the low melting point metal conductive pad 76 will increase. After that, the low melting point metal conductive pad 76 will be melted to form an open circuit. Furthermore, the width of the low melting point metal conductive pad 76 may be adjusted according to required current load. The fuse of the present invention is not limited to the chip fuse, and may be a resettable fuse. With reference to FIG. 4, FIG. 4 is a schematic diagram illustrating a cross-sectional structure of the resettable fuse. As illustrated in FIG. 4, the resettable fuse 80 includes a conductive polymer layer 82 and two electrodes 84 disposed on the two sides of the conductive polymer layer 82. When the current exceeds the current load limit of the resettable fuse 80, the temperature of the resettable fuse 80 will increase so as to form polymer chain scission inside the conductive polymer layer 82, such that the conductive polymer layer 82 will transfer from conductor to non-conductor. When the temperature falls down, the conductive polymer layer 82 will turn a conductor again. Consequently, the occurrence of higher current passing through the LED chip 54 can be avoided.

Figure 5:
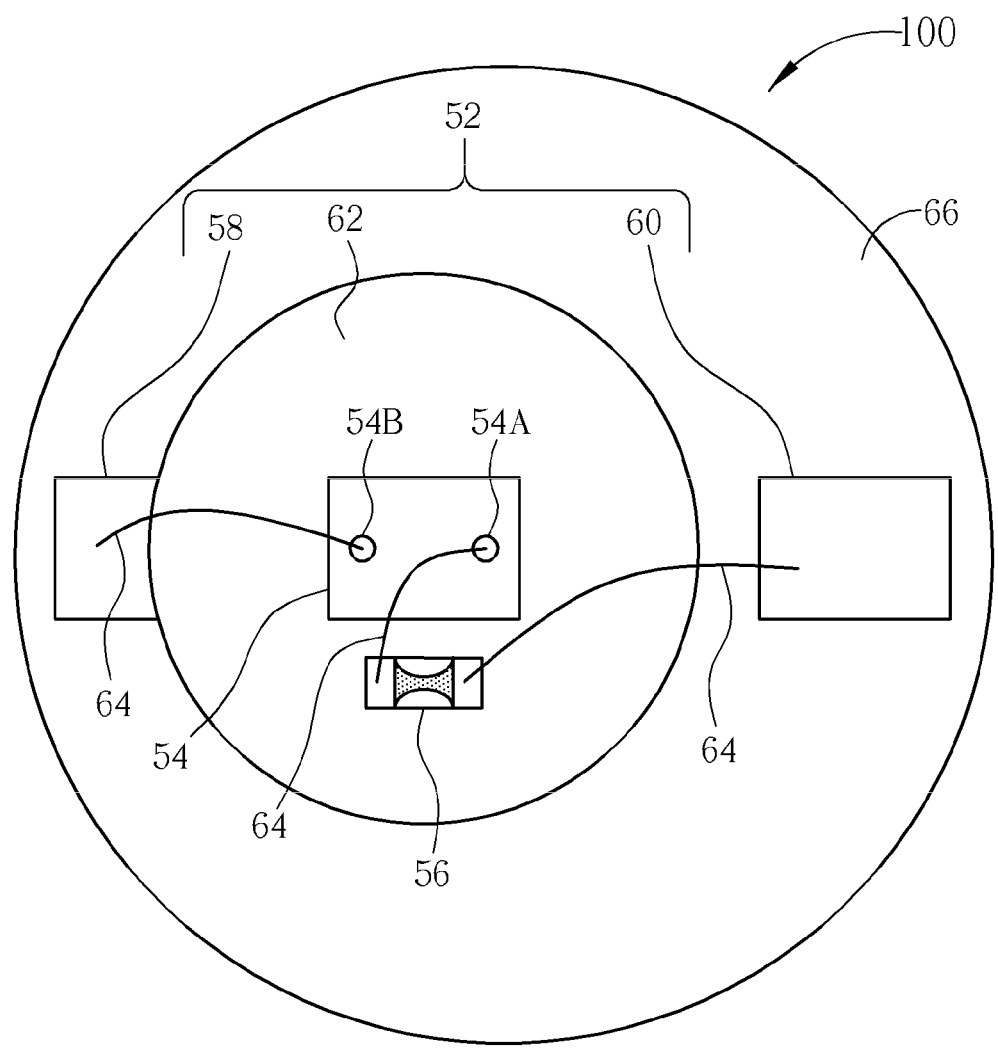
FIG. 5 is a top view schematic diagram illustrating an LED package structure of a second embodiment of the present invention.
Figure 6:
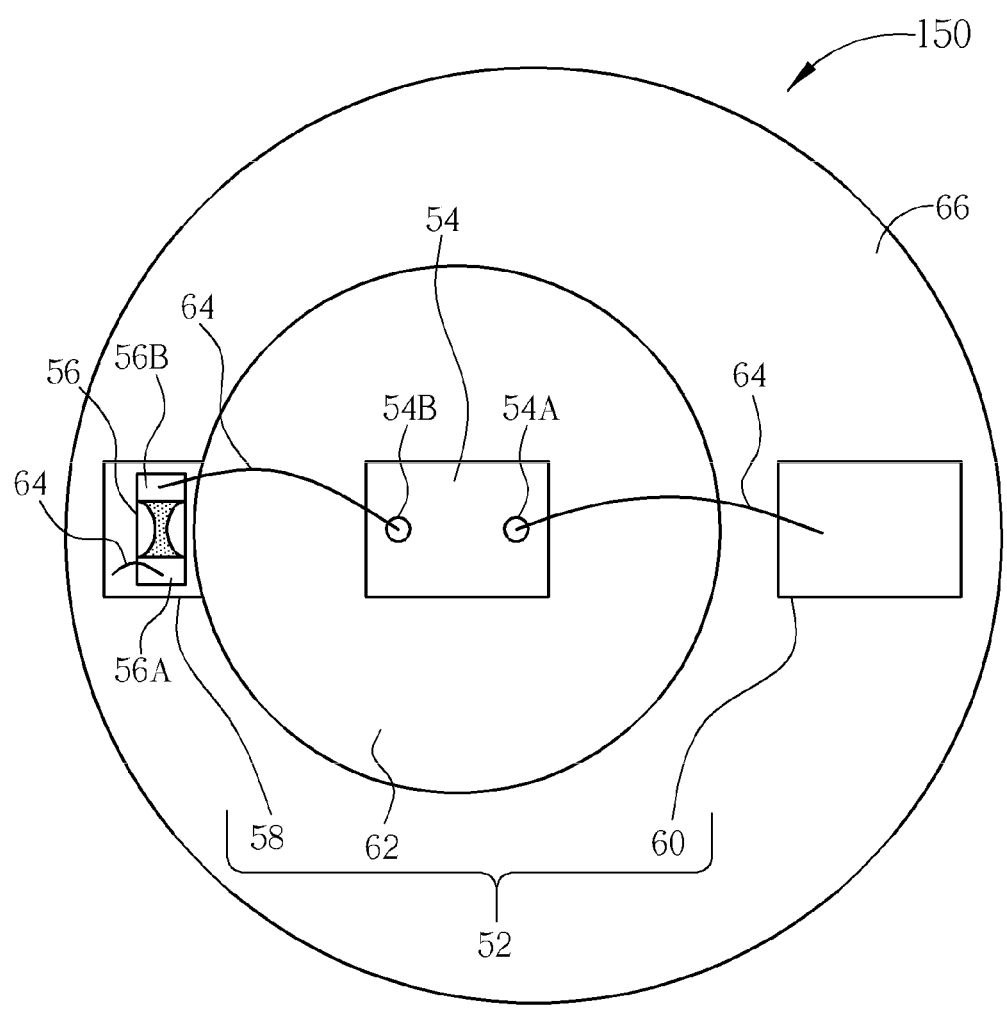
FIG. 6 is a top view schematic diagram illustrating an LED package structure of a third embodiment of the present invention.

The location of the fuse of the present invention is not limited to the aforementioned embodiment. Refer to FIG. 5 and FIG. 6. FIG. 5 is a top view schematic diagram illustrating an LED package structure of a second embodiment of the present invention, and FIG. 6 is a top view schematic diagram illustrating an LED package structure of a third embodiment of the present invention. Moreover, in order to simplify the description, identical elements denoted by the same numerals indicate the same devices, and redundant description of the structure identical to the first embodiment is no longer detailed. As illustrated in FIG. 5, as compared with the first embodiment, the fuse 56 of the LED chip package structure 100 of the second embodiment is disposed on the loading part 62 of the lead frame 52, the fuse 56 is disposed on one side of the LED chip 54 and is not in contact with the LED chip 54. In addition, as illustrated in FIG. 6, as compared with the first embodiment, the fuse 56 of the LED package structure 150 of the third embodiment is disposed on the first lead pin 58 of the lead frame 52. The first electrode 56A of the fuse 56 is electrically connected to the first pin 58, and the second electrode 56B of the fuse 56 is electrically connected to the positive electrode 54A of the LED chip 54. The negative electrode 54B of the LED chip 54 is electrically connected to the second lead pin 60. The location of the positive electrode 54A and the negative electrode 58B is not limited, and can be exchanged.

In summary, the present invention provides an LED package structure with a fuse, wherein the fuse is electrically connected to the LED chip in series. In such a connection, the LED chip and the circuit system electrically connected to the LED chip are free from high current.

Those skilled in the art will readily observe that numerous modifications and alterations of the device and method may be made while retaining the teachings of the invention.

What is claimed is:

1. A light emitting diode (LED) package structure, comprising:
 a lead frame comprising a first lead pin, a second lead pin, and a loading part connected to the first lead pin;
 an LED chip disposed on the loading part of the lead frame;
 a fuse comprising an internal circuit and electrically connected to the lead frame, the fuse being electrically connected to the LED chip in series; and
 an encapsulation covering the LED chip, the fuse and at least a part of the lead frame, wherein a positive electrode of the LED chip is electrically connected to a first electrode of the fuse, a second electrode of the fuse is electrically connected to the second lead pin of the lead frame, and a negative electrode of the LED chip is electrically connected to the first lead pin of the lead frame;
 wherein the internal circuit comprising a substrate and a low melting point metal conductive pad disposed on the substrate, and the internal circuit is melted under a current greater than a current limit threshold.

2. The LED package structure of claim 1, wherein the fuse is a chip fuse.

3. The LED package structure of claim 1, further comprising a plurality of metal conductive wires to be configured to electrically connect the fuse, the LED chip and the lead frame.

4. The LED package structure of claim 1, wherein a negative electrode of the LED chip is electrically connected to a first electrode of the fuse, and a second electrode of the fuse is electrically connected to the second lead pin of the lead frame, and a positive electrode of the LED chip is electrically connected to the first lead pin of the lead frame.

5. The LED package structure of claim 1, wherein the fuse is disposed on the second lead pin of the lead frame.

6. The LED package structure of claim 1, wherein the fuse is disposed on the loading part of the lead frame.

7. The LED package structure of claim 1, wherein the fuse is disposed on the first lead pin of the lead frame.

8. A light emitting diode (LED) package structure, comprising:
 a submount comprising a first conductive pin, a second conductive pin, and a loading part connected to the first conductive pin;
 an LED chip disposed on the loading part of the submount;
 a fuse comprising an internal circuit and electrically connected to the submount, the fuse being electrically connected to the LED chip in series; and
 an encapsulation covering the LED chip, the fuse and at least a part of the submount, wherein a positive electrode of the LED chip is electrically connected to a first electrode of the fuse, a second electrode of the fuse is electrically connected to the second conductive pin of the submount, and a negative electrode of the LED chip is electrically connected to the first conductive pin of the submount;

wherein the internal circuit comprising a substrate and a low melting point metal conductive pad disposed on the substrate, and the internal circuit is melted under a current greater than a current limit threshold.

9. The LED package structure of claim 8, wherein the fuse is a chip fuse.

10. The LED package structure of claim 8, further comprising a plurality of metal conductive wires to be configured to electrically connect the fuse, the LED chip and the submount.

11. The LED package structure of claim 8, wherein a negative electrode of the LED chip is electrically connected to a first electrode of the fuse, and a second electrode of the fuse is electrically connected to the second conductive pin of the submount, and a positive electrode of the LED chip is electrically connected to the first conductive pin of the submount.

12. The LED package structure of claim 8, wherein the fuse is disposed on one of the first conductive pin and the second conductive pin of the submount.

13. The LED package structure of claim 8, wherein the fuse is disposed on the loading part of the submount.

* * * * *